United States Patent
Tanabe et al.

(10) Patent No.: US 6,608,119 B2
(45) Date of Patent: Aug. 19, 2003

(54) WATER-BASE INK, METHOD OF MANUFACTURING THE INK, AND METHOD OF PRINTING USING THE INK

(75) Inventors: Seiichi Tanabe, Suwa (JP); Kiyohiko Takemoto, Suwa (JP); Makoto Taniguchi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 94 days.

(21) Appl. No.: 09/771,706

(22) Filed: Jan. 30, 2001

(65) Prior Publication Data

US 2001/0047044 A1 Nov. 29, 2001

(30) Foreign Application Priority Data

| Feb. 1, 2000 | (JP) | 2000-024430 |
| Feb. 1, 2000 | (JP) | 2000-024433 |
| Dec. 19, 2000 | (JP) | 2000-385532 |
| Dec. 19, 2000 | (JP) | 2000-385533 |

(51) Int. Cl.$^7$ .......... C08F 2/46; C09D 11/00; B05D 1/00; B41J 2/01; H05K 1/02
(52) U.S. Cl. .......... 522/74; 522/75; 522/81; 522/83; 522/84; 522/85; 106/35; 427/466; 347/1
(58) Field of Search .......... 522/75, 81, 84, 522/85, 79, 96, 74, 83; 106/35; 427/466; 347/1

(56) References Cited

U.S. PATENT DOCUMENTS

| 5,166,186 A | * | 11/1992 | Kojime et al. | 522/37 |
| 5,275,646 A | * | 1/1994 | Marshall et al. | 106/31.32 |
| 5,395,863 A | * | 3/1995 | Burns et al. | 522/103 |
| 5,623,001 A | | 4/1997 | Figov | |
| 5,738,916 A | * | 4/1998 | Noguchi et al. | 216/13 |
| 6,231,654 B1 | * | 5/2001 | Elwakil | 106/31.47 |

FOREIGN PATENT DOCUMENTS

| JP | A-3-216379 | 9/1991 |
| JP | A-3-220218 | 9/1991 |
| JP | A-5-186725 | 7/1993 |
| JP | A-5-269983 | 10/1993 |
| JP | A-8-218018 | 8/1996 |
| JP | A-10-219158 | 8/1998 |
| JP | A-10-287035 | 10/1998 |
| JP | A-11-87883 | 3/1999 |
| JP | A-11-172177 | 6/1999 |

OTHER PUBLICATIONS

Machine translation of JP 11087883 A obtained from Japan Patent Office Industrial Property Digital Library.*
Machine translation of JP 10219158 A obtained from Japan Patent Office Industrial Property Digital Library.*

* cited by examiner

*Primary Examiner*—Susan W. Berman
(74) *Attorney, Agent, or Firm*—Oliff & Berridge, PLC

(57) ABSTRACT

The invention provides ink which is best suited for inkjet printing of a printed substrate. The ink is a photo polymerizing type water-base ink including at least a colorant, a photo polymerization resin, a photo initiator, and a water-base solvent. The photo polymerization resin includes oligomer particles in an emulsion state and monomers which reside in the oligomer particles. The water-base ink contains, with content ratio in terms of the percentage weight, 5% of ethyleneglycol, and between 0.1% to 10% of 2-pyrrolidone and N-acryloyl morpholine combined.

12 Claims, No Drawings

WATER-BASE INK, METHOD OF MANUFACTURING THE INK, AND METHOD OF PRINTING USING THE INK

FIELD OF INVENTION

The present invention relates to water-base ink, a method of manufacturing the ink and a printing method using the ink, and in particular, to ink that is ideal for inkjet printing on a print surface where water-base solvent does not permeate, such as on a printed substrate.

DESCRIPTION OF RELATED ART

Ink jet printing is a printing method in which small drops of ink are ejected out of a nozzle to attach to a printing surface of a print medium, such as paper or other medium, and then solvent is dried from the attached ink (the attached ink from which the solvent is dried is hereafter referred to as the ink attachment) and the colorant is fixed on the printed surface. This method enables high-speed printing of high-resolution and high quality images. In general, ink used in ink jet printing has a water-base solvent as the main component, to which colorant and a penetrant such as glycerin (additives used to prevent clotting) are added.

However, if the printing surface is made of a surface which makes the permeation of a water-base solvent extremely difficult or even impossible, for example, board or film surfaces made of regular paper, cloth, metal, phenol, melamine, vinyl chloride, acrylic or plastic such as polycarbonate, execution of ink jet printing using the aforementioned ink designed for normal ink jet printing becomes difficult.

For this reason, in this type of usage, it becomes necessary to have the ink contain an ingredient which enables stable fixing of colorant (an ingredient which remains as a film on the printing surface after being dried).

Moreover, when printing is performed on printed substrates and the like, the ink must dry quickly, and the ink film must have a high level of chemical proof properties, and the ink film must be very hard.

As an example of ink with the aforementioned qualities, Japanese Laid Open Patent Publication 3-216379 discloses an ink jet ink that contains a colorant and an ingredient which becomes polymerized upon radiation of ultra-violet rays (polymerizing monomer, oligomer, or photoinitiator).

Moreover, U.S. Pat. No. 5,623,001 discloses ink jet ink that contains water, and polymerization material (oligomer or mixture of oligomer and monomer) which admixes with water and hardens with ultra-violet rays, photoinitiator and colorant.

Furthermore, Japan Laid Open Patent Publication 3-220218 discloses a screen printing ink component that hardens with ultra-violet rays and which contains polyurethane (meth) acrylate resin, N-vinyl pyrrolidone, acryloyl morpholine, photoinitiator and pigment.

In the ink described in these publications, photoinitiators in the ink attachment are activated by irradiation of ultra-violet rays after the ink is attached on the printing surface, and a polymerizing oligomer and/or a monomer's polymerizing reaction is generated, which polymerization fixes colorant in the ink attachment on the printing surface. Hence, it is expected that the ink attachment will dry in a short time and a hard ink film with a high level of chemical proofness will be obtained with a high color concentration and uniform printing without smearing and unevenness.

However, the ink described in these publications needs to be enhanced in terms of stability and ink film strength.

SUMMARY OF THE INVENTION

An object of the present invention is to provide a photo polymerization type water-base ink having an extremely high level of printing stability and ink film strength after light irradiation when used in ink jet printing, such as providing ink with an enhanced capability for ink jet printing onto a printed substrate.

In order to achieve the aforementioned object, the present invention provides photo polymerization water-base ink including colorant, photo polymerization resin, photoinitiator, and water-base solvent. The photo polymerization resin includes oligomer particles in the emulsion state and a monomer residing in the oligomer particles. The polar solvent includes one or more of 2-pyrrolidone, N-acryloyl morpholine and N-vinyl-2-pyrrolidone with weight ratio of between 0.1 to 10 is also contained.

In this ink, because photo polymerizing ink includes oligomer particles in the emulsion state and monomer residing in the oligomer particles, the photo polymerization resin is dispersed uniformly in the ink and is maintained in this condition for a long time. Moreover, because the polar solvent includes one or more of 2-pyrrolidone, N-acryloyl morpholine and N-vinyl-2-pyrrolidone with a weight ratio of between 0.1% to 10%, an extremely high level of printing stability is obtained when used in ink jet printing.

In the water-base ink of the present invention, the polar solvent preferably contains 2-pyrrolidone and N-acryloyl morpholine.

By so doing, water-base ink of the present invention assures an extremely high level of printing stability and ink film strength after light irradiation when used in ink jet printing.

Moreover, the present invention provides photo polymerization water-base ink, including: colorant, photo polymerization resin, photoinitiator, and water-base solvent that includes polar solvent having a reactive group (vinyl radical, acryl radical, metacryl radical and others) reacting with photo polymerization resin.

The ratio of the polar solvent in the ink, for example, a weight ratio of between 0.1% to 10%, preferably between 1% to 7%.

This ink exhibits a high level of storage stability with an extremely high level of printing stability, strong ink film and superior chemical proof property when used in ink jet printing. As indicated in 1 and 2 below, these advantages may be provided due to a polar solvent containing a reaction radical which reacts with photo polymerization resin.

1. Because polarity of the solvent is large compared to that of a normal surfactant used to secure printing stability, the dissolution power of the solvent with respect to water is large. Therefore, the solvent does not distort the dispersion properties between the colorant and the photo polymerization resin and enables stable dissolution or dispersion of the ingredients which make up the other ink components. This solvent, because it has a polymerizing reaction radical in its molecular structure, achieves high bridge density in the film.

2. N-acryloyl morpholine and N-vinyl-2-pyrrolidone are typical examples of the solvent.

In the water-base ink, the photo polymerization resin preferably includes oligomer particles in an emulsion state and monomers residing in the oligomer particles.

Polyesteracrylate, polyurethaneacrylate, epoxyacrylate, polyetheracrylate, oligoacrylate, alkidacrylate and polyoleacrylate are some of the examples that can be used as oligomer in the present invention. Of these, it is preferable to use polyesteracrylate or polyurethaneacrylate.

In the present invention, molecular weight of the oligomer to be used is in the 500–20,000 range, preferably in the 500–10,000 range.

In the ink of the present invention, the oligomer content in terms of the percentage weight is in the 1% to 50% range, and preferably in the 3%–30% range.

Monofunctional acrylate and methacrylate, multifunctional acrylate and metaacrylate are examples of monomers that can be used in the present invention. These monomers having low molecular polyole acrylate and methacrylate have the merit of low viscosity and speedy hardening properties. The following are typical monomers which may be used in the present invention: diethyleneglycol diacrylate, neopentylglycol diacrylate, 1,6 hexanedioldiacrylate, hydroxypropyl ester-neopentyl-glycoldiacrylate, trimethylol-propane-triacrylate, pentaerythritol-triacrylate, dipenthacrythritol-hexaacrylate, acryloyl-morpholine, 2-phenoxy-ethylacrylate, phthalic acid-hydrogen-(2,2,2-triacrylonitrille-oxymethyl)ethyl, dipentaetythritol-polyacrate, dipentaerythritol-polyacryrate, and others.

Of these listed above, acryloyl morpholine, 2-phenoxyethylacrylate, phthalic acid hydroen-(2,2,2,-triacrylonitrille oxymethyl0ethyl, dipenthaerythritol-polyacrylate, dipentaerithrytol-polyacrylate are preferred monomers.

In the present invention, the molecular weight of the monomer to be used is in the 100–3,000 range, and preferably in the 100–2,000 range.

In the ink of the present invention, the monomer content in terms of the percentage weight is in the 1% to 70% range, and preferably in the 3%–50% range.

Here, because the oligomer and the monomer are copolymerized to form a 3-dimensional substance, the ratio of oligomer and the monomer in the ink should be determined considering polymerization efficiency, polymerization speed, post-polymerization contraction rate, and the film strength of the polymer and the like. In fact, the ratio of the oligomer and the monomer in the ink should be in the range of 95 to 5 (oligomer to monomer)-40 to 60, and preferably the range of 90 to 10–50 to 50.

Typical photoinitiators to be used in the ink of the present invention are those which start the polymerization of the photo polymerization resin (oligomer and monomer) by absorbing ultra-violet rays in about the 250 nm–450 nm range, for example, and generating radicals or ions. Typical photoinitiators which may be used in the ink of the present invention are as follows:

benzoinmethylether, benzoinethylether, isopropylbenzoinether, isobutylbenzoinether, 1-phenyl-1,2-propanedione-2-(0-ethoxycarbonyl)oxime, benzyl, diethoxyacetophenone, benzophenone, chlorothioxanthone, 2-chlorothioxanthone, isopropylthioxanthone, 2-methylthioxanthone, isopropylthioxanthone, 2-methylthioxanthone, polychlorinatepolyphenyl, hexachlorobenzen and others.

Of these, isobutylbenzoinether, 1-phenyl-1,2-propanedione-2(0-ethoxycarbonyl)oxime are preferred.

Photoinitiators which are usable in the ink of the present invention are sold under the following product names and are easily obtainable. Vicure 10, 30 (made by Stauffer Chemical), Irgacure 184, 651, 2959, 907, 369, 1700, 1800, 1850, 819 (made by Chiba Specialty Chemicals), Darocurel 173 (made by EM Chemical), Quantacure CTX, ITX (made by Aceto Chemical), Lucirin TPO (made by BASF).

Either pigment or dye, as long as it disperses in the water, may be used as a colorant in the ink of the present invention. However, in the case of printing on a printed substrate, the use of a pigment is preferred.

Either an inorganic or organic pigment may be used as a pigment. Titanoxide, iron oxide and carbon black are examples of an inorganic pigment that can be used. Any carbon black which is produced using publicly known methods such as the contact method, the furnace method or the thermal method may be used.

Azo pigment (including azolac, insoluble azo pigment, concentrated azo pigment, chelate azo pigment), polycyclic pigment (for example, phtalocyanin pigment, perylene pigment, anthraquinone pigment, quinacridon pigment, dioxzine pigment, thioindigo pigment, iso-indolinone pigment, quinofuraron pigment), dye chelate (for example, alkaline dye chelate, acid dye chelate), nitro pigment, nitroso pigment, and aniline black are examples of organic pigment that can be used.

In the ink of the present invention, colorant is preferably added as a colorant dispersion liquid to be obtained by being dispersed in the water-base solvent with dispersion agents or surfactant. The use of a dispersion agent which is commonly used to prepare a colorant dispersion liquid, such as a high polymer dispersion agent, is preferred. Here, the dispersion agent and surfactant to be contained in the colorant dispersion liquid naturally function as the dispersion agent and surfactant of the ink ingredient other than the colorant.

In the ink of the present invention, the colorant content in terms of the percentage weight is in the 1% to 50% range, and preferably in the 2%–30% range.

The ink of the present invention contains, as water-base solvent, water or a mixture of water and water-base organic solvent having a low boiling point. Pure water or super-pure water such as ion exchange water, ultra filtration water, reverse osmosis water or distilled water may be used. Moreover, use of water sterilized by the irradiation provided by ultra-violet rays or the addition of hydrogen peroxide is desired for the prevention of mold and bacteria generation when the ink is stored for a long time.

Methanol, ethanol, N-propylalcohol, iso-propylalcohol, n-butanol, sec-byutanol, tert-butanol, iso-butanol, n-pentanol are examples of water-base organic solvent having a low boiling point. Of these, the use of univalent alcohol is preferred. Use of these solvents enables a reduction in ink drying time.

When organic solvent with low boiling point is added as a water-base solvent to the ink of the present invention, the amount to be added is preferably between 0.1% to 10% in terms of the percentage weight, and more preferably between 0.5% to 5% in terms of the percentage weight.

The water-base ink of the present invention preferably contains penetrant which includes an organic solvent having a high boiling point other than the polar solvent.

The following are examples of organic solvent having a high boiling point to be added as a penetrant to the ink of the present invention, multi-valiant alcohol such as ethyleneglycol, diethyleneglycol, triethyleneglycol, polyethyleneglycol, polypropyleneglycol, propyleneglycol, butyleneglycol, 1,2,6-hexantriole, thioglycol, hexyleneglycol, glycerin, trimethyrolethan, trimethyrolepropane; multi-valiant alkylether such as ethyleneglycolmonoethylether, ethyleneglycolmonobutylether, diethyleneglycolmonomethylether, diethyleneglycolmonoethylether, diethyleneglycolmonobutylether, triethyleneglycolmonomethylether, triethyleneglycolmonoethylether, triethyleneglycolmonobutylether; urea, 2-pyrolidone, N-methyl-2-pyrolidone, 1,3-dimethyl-2-imidazolidinone.

In the ink of the present invention, the content of penetrant in terms of a percentage weight should be between 5% to 40%, and preferably between 2% to 20%.

The ink of the present invention may contain multi-valiant metallic salt, polyarilamin or its derivatives, inorganic oxide colloid, penetrant, pH adjuster, an anti-corrosion agent and/or an anti-mold agent.

As the oligomer, the water-base ink of the present invention preferably contains a urethane oligomer in the range in terms of a percentage weight of between 3% to 10%. As the monomer, the water-base ink of the present invention preferably contains dipentaerythritol polyacylate in the range of between 3% to 10%, in terms of percentage weight. The ink also preferably contains 2-pyrrolidone and N-acryloyl morpholine in a combined range of 0.1% to 10% in terms of percentage weight, a photoinitiator in the range of 0.3% to 2.0% in terms of percentage weight, ethylene glycol in the range of 2% to 20% in terms of percentage weight, and pigment including titanium dioxide particles, as colorant, in the range of 3% to 20% in terms of percentage weight.

Moreover, the present invention provides an ink production method, of a type of water-base ink, wherein monomer is added to and agitated in an emulsion where oligomer is dispersed in the water, resulting in monomer residing in the oligomer particles in emulsion state, after which the process ingredients other than the photo polymerization resin are added to the liquid obtained through the process.

In this method, the photoinitiator may be added to an emulsion with the monomer during the process, or it may be added to the liquid obtained through the process.

Moreover, the present invention provides an ink jet printing method wherein the ink is attached on the printing surface in a predetermined shape by ejecting water-base ink with an ink jet apparatus, after which colorant is fixed on the printing surface by polymerizing photopolymerization resin in the attached ink by irradiating light on the printing surface.

In this method, use of ink containing a photoinitiator which is activated by ultra-violet ray irradiation is preferred, with ultra-violet ray irradiation conducted as the light irradiation.

In this case, ultra-violet ray irradiation is preferably conducted with an ultraviolet illumination of 100–10,000 mJ/cm$^2$.

These steps assure a sufficient polymerization reaction and deterioration of colorant by ultra-violet ray irradiation is prevented. More preferable ultra-violet irradiation is 500–5000 mJ/cm$^2$.

Metal halide lamps, xenon lamps, carbon arc lights, chemical lamps, low voltage mercury lamps, and high voltage mercury lamps are some of the light sources that may be used for ultra-violet ray irradiation. These lamps are available in regular stores, as H lamps, D lamps, V lamps and others made by Fusion System Co. for example.

In the ink jet printing method of the present invention, water-base solvent in the ink attachment is preferably vaporized by adding heat either before or concurrently with light irradiation. By so doing, a polymerization reaction is conducted efficiently and a harder ink film having a high chemical proof property is formed in a short period of time.

A method in which heating is accomplished by making a heat source contact the printing surface, or a method in which infrared light or microwave (magnetic wave with maximum wavelength at about 2,450 Mhz) is irradiated instead of making a heat source contact the printing surface, may be used as the heating method.

The present invention also covers printed materials which are printed with the ink jet printed method of the present invention.

Moreover, the present invention provides a printed substrate production method wherein printing is conducted on the printed substrate using, the ink jet printing method of the present invention with the water-base ink containing pigment including titanium dioxide as colorant.

Moreover, the present invention provides a printed substrate which is printed using the ink jet printing method of the present invention with the water-base ink containing pigment including titanium dioxide as the colorant.

DETAILED DESCRIPTION OF PREFERRED EMBODIMENTS

First Embodiment

"NR-445" made by Ashibia KK was prepared as an emulsion in which a urethane oligomer is dispersed in water.

The oligomer content in the emulsion in terms of percentage weight is 38%.

Dispersion liquid in which titanium dioxide (white pigment) is dispersed in water is prepared as colorant A. The titanium dioxide content in terms of percentage weight in the dispersion liquid is 55%.

Dispersion liquid in which carbon black (black pigment) is dispersed in water is prepared as colorant B. The carbon black content in terms of percentage weight in the dispersion liquid is 30%.

Dipentaerythritol polyacrylate "A-9530" made by Shin Nakamura Kagaku KK is prepared as a monomer.

"Irugacure 1700" made by Chiba Specialty Chemicals KK is prepared as a photoinitiator.

Ethyleneglycol is prepared as a penetrant.

As the polar solvent to be added especially in the present invention, 2-pyrolidone is prepared.

Pure water is prepared as the water-base solvent.

Using these materials, first, a liquid mixture in which photo initiator is added to liquid monomer is prepared. Next, a high-speed planetary motion type mixing apparatus is used to agitate the oligomer emulsion while the mixture solution is added slowly. By so doing, starch syrup-like liquid with high viscosity is obtained.

The liquid represents a liquid in which a monomer and a photoinitiator reside in the oligomer particles in an emulsion state. To this liquid, pure water, colorant A or B, ethyleneglycol and 2-pyrolidone are added, and the mixture is agitated. As a result, photo polymerizing water-base ink containing pigment (colorant) including titanium dioxide or carbon black, photopolymerization resin with monomer residing in the oligomer particles in an emulsion state, ethyleneglycol, 2-pyrolidone, and photoinitiator (residing in the oligomer particles) is obtained.

Here, the production of this ink is preferably conducted in an environment in which light (ultra-violet rays in particular) is shielded. In addition, high storage stability is obtained if the ink is stored in an environment shielded from light (ultra-violet rays in particular).

(No. 1-1)

Water-base ink was produced using the aforementioned method and using colorant A (pigment including titanium dioxide). The amount of each ingredient added were: dispersion liquid of colorant A; 28.0 parts by weight, oligomer emulsion; 20.0 parts by weight, monomer; 8.0 parts by weight, photoinitiator; 1.5 parts by weight, ethyleneglycol; 5.0 parts by weight, 2-pyrolidone; 2.0 parts by weight, and pure water; 35.5 parts by weight.

The content of each ingredient in terms of the percentage weight in the ink obtained were: titanium dioxide particles: 15.4%, oligomer; 7.6%, monomer; 8.0%, photoinitiator; 1.5%, ethyleneglycol; 5.0%, and 2-pyrolidone; 2.0%.

(No. 1-2)

Water-base ink was produced using the aforementioned method and using colorant A (pigment including titanium dioxide). The amount of each ingredient added were:

dispersion liquid of colorant A; 28.0 parts by weight, oligomer emulsion; 20.0 parts by weight, monomer; 8.0 parts by weight, photoinitiator; 1.5 parts by weight, ethyleneglycol; 5.0 parts by weight, 2-pyrolidone; 5.0 parts by weight, and pure water; 32.5 parts by weight.

The content of each ingredient in terms of the percentage weight in the ink obtained were: titanium dioxide particles: 15.4%, oligomer; 7.6%, monomer; 8.0%, photoinitiator; 1.5%, ethyleneglycol; 5.0%, and 2-pyrolidone; 5.0%.

(No. 1-3)

Water-base ink was produced using the aforementioned method and using colorant A (pigment including titanium dioxide). The amount of each ingredient added were:

dispersion liquid of colorant A; 28.0 parts by weight, oligomer emulsion; 20.0 parts by weight, monomer; 8.0 parts by weight, photoinitiator; 1.5 parts by weight, ethyleneglycol; 5.0 parts by weight, 2-pyrolidone; 8.0 parts by weight, and pure water; 29.5 parts by weight.

Content of each ingredient in terms of the percentage weight in the ink obtained were: titanium dioxide particles: 15.4%, oligomer; 7.6%, monomer; 8.0%, photoinitiator; 1.5%, ethyleneglycol; 5.0%, and 2-pyrolidone; 8.0%.

(No. 1-4)

Water-base ink was produced using the aforementioned method and using colorant B (pigment including carbon black). The amount of each ingredient added were: dispersion liquid of colorant B; 33.0 parts by weight, oligomer emulsion; 20.0 parts by weight, monomer; 8.0 parts by weight, photoinitiator; 1.5 parts by weight, ethyleneglycol; 5.0 parts by weight, 2-pyrolidone; 5.0 parts by weight, and pure water; 27.5 parts by weight.

The content of each ingredient in terms of the percentage weight in the ink obtained were: carbon black particles: 9.9%, oligomer; 7.6%, monomer; 8.0%, photoinitiator; 1.5%, ethyleneglycol; 5.0%, and 2-pyrolidone; 5.0%.

(No. 1-5)

Water-base ink was produced using the aforementioned method and using colorant A (pigment including titanium dioxide). In this case, however, 2-pyrolidone was not added. The amount of each ingredient added were: dispersion liquid of colorant A; 28.0 parts by weight, oligomer emulsion; 20.0 parts by weight, monomer; 8.0 parts by weight, photoinitiator; 1.5 parts by weight, ethyleneglycol; 5.0 parts by weight, and pure water; 37.7 parts by weight.

The content of each ingredient in terms of the percentage weight in the ink obtained were: titanium dioxide particles: 15.4%, oligomer; 7.6%, monomer; 8.0%, photoinitiator; 1.5%, ethyleneglycol; 5.0%.

(Printing Using Ink Jet Printing)

Each ink obtained in No. 1-1~1-5 was filled in the head (64 nozzles) of the ink jet printer "MJ510C" made by Seiko Epson Corp and printing test was conducted using each ink.

First, ink was injected from the head onto regular paper to form ink attachment on the paper in a shape of predetermined character. Next, ultra-violet rays of wavelength 365 nm was irradiated from a metal halide lamp on the regular paper. Ultra-violet rays were irradiated with a condition of 2000 mJ/cm$^2$ ultra-violet ray illumination, which caused photoinitiator to activate and photopolymerization resin in the ink attachment to be polymerized to form ink film containing colorant, and the colorant were fixed on the paper. As a result, predetermined characters were printed on the normal paper.

Moreover, by ejecting each from the head in a similar manner, ink was formed on the surface of printed substrate on which film including resist (PSR4000) made by Taiyo Ink Mfg. Co., and an ink attachment is formed in the shape of predetermined characters. Next, the printed substrate was heated for 10 minutes at 50° and then ultra-violet rays of wavelength 365 nm were irradiated from the metal halide lamp. The ultra-violet ray irradiation was conducted under condition of 2000 mJ/cm$^2$. The photoinitiator in the ink application was polymerized and was made into ink film containing colorant and the colorant was fixed on the printed substrate surface. As a result, the predetermined characters were printed on the printed substrate surface.

(Cleaning Recovery)

Continuous printing test on 100 sheets of A4 size normal paper were repeated 10 times using each ink of No. 1-1~1-5 and using the same printing method as described above. However, the first printing was conducted using a head which was cleaned with solvent for washing inside of the nozzle, and prior to each of 10 continuous printing test, whether or not the printing was normal was checked. Also the next printing was conducted by cleaning the same head each time. The number of normal printing was checked.

(Continuous Printing Stability)

A continuous printing test on 500 sheets of A4 size normal paper was repeated 5 times using each ink of No. 1-1~1-5 and using the same printing method as described above. Then it was checked to see whether the printing on the 500$^{th}$ sheet was of good quality. This test was conducted five times.

(Pencil Hardness Test)

Printing was made on a printed substrate using each ink of No. 1-1~1-5 and using the same printing method as described above to measure pencil hardiness of the printed materials according to the method described in "JIS K5400 (a method of pencil scratch test)."

(Chemical Proof Property)

Printing was made on a printed substrate using each ink of No. 1-1~1-5 and using the same printing method as described above, after which the printed substrate was immersed for 5 minutes in ethanol. Next the printed substrate was removed from the ethanol and the print on the substrate was rubbed back and forth for five times to check the chemical proof property of the print part. The result was evaluated as follows: if the print was not all peeled off, it was denoted by "A", if the print was partially peeled off, it was denoted by "B", and if all the print was peeled off, it was denoted by "C".

Evaluation of the performance is tabulated in Table 1.

From Table 1, ink of No. 1-1~1.4 which contain 2-pyrolidone in terms of a percentage weight in the range of 2.0–8.0%, are found to be superior to the ink of No. 1-5 (control) without 2-pyrolidone on cleaning recovery and continuous printing stability when used as ink jet printing ink while maintaining ink film strength and chemical proof property.

Second Embodiment

Water-base inks No. 2-1~2-4 were produced using the same method as in the first embodiment with the exception of using N-vinyl-2-pyrplidone as a polar solvent to be added in the present invention. Moreover, ink the same as No. 1-5 was prepared as ink No. 2-5, which corresponds to a control group. Using each of these inks and the method used in the first embodiment, performance was evaluated. The result of performance evaluation and component of each ink are summarized in Table 2.

From Table 2, the inks of No. 2-1~2.4 which contain N-vinyl-2-pyrrolidone in terms of the percentage weight of the range of 2.0–8.0%, are found to be superior to the ink of No. 1-5 (control) without 2-pyrrolidone on cleaning recovery and continuous printing stability when used as an ink jet printing ink, while maintaining the ink film strength and chemical proof property.

Third Embodiment

Water-base inks No. 3-1~3-4 were produced using the same method as in the first embodiment with exception of using N-acryloyl morpholine as the polar solvent to be added in the present invention. Moreover, ink the same as No. 3-5 was prepared as ink No. 2-5, which corresponds to a control group. In addition, ink the same as said No. 1-2 was prepared (ink containing 2-pyrrolidone in place of N-acryloyl morpholine was prepared).

Using each of these inks, a cleaning recovery test, pencil hardness test and chemical proof test were conducted.

Moreover, a test to check continuous printing stability was conducted by continuously printing on 500 sheets of A4 size, normal paper similar to the first embodiment, and by checking dot removal on the $500^{th}$ printing.

In the "dot removal" test, the number of dots removed caused by no ejection of ink from the nozzle was counted. This number corresponds to the number of nozzles, out of 64 nozzles from which ink was not ejected. In the "crooked ejection test", the number of nozzles, out of 64 nozzles, from which ink was ejected at an angle instead of straight down was checked, and the results of the performance evaluation and the components of each ink are summarized in Table 3.

From Table 3, inks No. 3-1~3.4 which contain N-acryloyl morpholine in the range of 2.0–8.0% in terms of the percentage weight are found to be superior to the ink of No. 3-5 (control) without N-acryloyl morpholine on cleaning recovery and continuous printing stability when used as ink jet printing ink, while maintaining ink film strength and chemical proof property.

Moreover, the inks No. 3-1~3-4 which contain N-acryloyl morpholine are superior to the ink of No. 3-6 which contains 2-pyrrolidone in place of N-acryloyl morpholine particularly on pencil hardness and ink film strength.

Fourth Embodiment

Inks No. 4-1~4-17 were prepared using the same material as in the first embodiment and using the same method as in the first embodiment. However, in place of colorant A, dispersion liquid (colorant C) in which titanium dioxide (white pigment) is dispersed in water was prepared in which the content ratio in terms of the percentage weight was 60%.

(No. 4-1)

Water-base ink was produced using the same method as in the first embodiment and using colorant C (pigment including titanium dioxide). The amount of each ingredient added were: dispersion liquid of colorant C, 8.3 parts by weight; oligomer emulsion, 18.4 parts by weight; monomer, 7.0 parts by weight; photoinitiator, 1.0 parts by weight; ethyleneglycol, 5.0 parts by weight; 2-pyrolidone, 5.0 parts by weight; and pure water, 55.3 parts by weight.

The content of each ingredient in terms of the percentage weight in the ink obtained were: titanium dioxide particles, 5.0%; oligomer, 7.0%; monomer, 7.0%; photoinitiator, 1.0%; ethyleneglycol, 5.0%; and 2-pyrolidone, 5.0%.

(No. 4-2)

Water-base ink was produced using the same method as in the first embodiment and using colorant C (pigment including titanium dioxide). The amount of each ingredient added were: dispersion liquid of colorant C, 16.7 parts by weight; oligomer emulsion, 18.4 parts by weight; monomer, 7.0 parts by weight; photoinitiator, 1.0 parts by weight; ethyleneglycol, 5.0 parts by weight; 2-pyrolidone, 5.0 parts by weight; and pure water, 46.9 parts by weight.

The content of each ingredient in terms of the percentage weight in the ink obtained were: titanium dioxide particles, 10.0%; oligomer, 7.0%; monomer, 7.0%; photoinitiator, 1.0%; ethyleneglycol, 5.0%; and 2-pyrolidone, 5.0%.

(No. 4-3)

Water-base ink was produced using the same method as in the first embodiment and using colorant C (pigment including titanium dioxide). The amount of each ingredient added were: dispersion liquid of colorant C, 25.0 parts by weight; oligomer emulsion, 18.4 parts by weight; monomer, 7.0 parts by weight; photoinitiator, 1.0 parts by weight; ethyleneglycol,5.0 parts by weight; 2-pyrrolidone, 5.0 parts by weight; and pure water, 38.6 parts by weight.

The content of each ingredient in terms of the percentage weight in the ink obtained were: titanium dioxide particles, 15.0%; oligomer, 7.0%; monomer, 7.0%; photoinitiator, 1.0%; ethyleneglycol, 5.0%; 2-pyrrolidone, 5.0%.

(No. 4-4)

Water-base ink was produced using the same method as in the first embodiment and using colorant C (pigment including titanium dioxide). The amount of each ingredient added were: dispersion liquid of colorant C, 33.3 parts by weight; oligomer emulsion, 18.4 parts by weight; monomer, 7.0 parts by weight; photoinitiator, 1.0 parts by weight; ethyleneglycol, 5.0 parts by weight; 2-pyrrolidone, 5.0 parts by weight; and pure water, 30.3 parts by weight.

The content of each ingredient in terms of the percentage weight in the ink obtained were: titanium dioxide particles, 20.0%; oligomer, 7.0%; monomer, 7.0%; photoinitiator, 1.0%; ethyleneglycol, 5.0%; and 2-pyrrolidone, 5.0%.

(No. 4-5)

Water-base ink was produced using the same method as in the first embodiment and using colorant C (pigment including titanium dioxide). The amount of each ingredient added were: dispersion liquid of colorant C, 16.7 parts by weight; oligomer emulsion, 18.4 parts by weight; monomer, 7.0 parts by weight; photoinitiator, 0.3 parts by weight; ethyleneglycol, 5.0 parts by weight; 2-pyrrolidone, 5.0 parts by weight; and pure water, 47.6 parts by weight.

The content of each ingredient in terms of the percentage weight in the ink obtained were: titanium dioxide particles, 10.0%; oligomer, 7.0%; monomer, 7.0%; photoinitiator, 0.3%; ethyleneglycol, 5.0%; and 2-pyrolidone, 5.0%.

(No. 4-6)

Water-base ink was produced using the same method as in the first embodiment and using colorant C (pigment including titanium dioxide). The amount of each ingredient added were: dispersion liquid of colorant C, 16.7 parts by weight; oligomer emulsion, 26.3 parts by weight; monomer, 3.0 parts by weight; photoinitiator, 2.0 parts by weight;

ethyleneglycol, 5.0 parts by weight; 2-pyrrolidone, 5.0 parts by weight; and pure water, 42.0 parts by weight.

The content of each ingredient in terms of the percentage weight in the ink obtained were: titanium dioxide particles: 10.0%, oligomer; 10.0%, monomer; 3.0%, photoinitiator; 2.0%, ethyleneglycol; 5.0%, 2-pyrrolidone: 5.0%.

(No. 4-7)

Water-base ink was produced using the same method as in the first embodiment and using colorant C (pigment including titanium dioxide). The amount of each ingredient added were: dispersion liquid of colorant C, 16.7 parts by weight; oligomer emulsion, 7.9 parts by weight; monomer, 10.0% parts by weight; photoinitiator, 2.0 parts by weight; ethyleneglycol, 5.0 parts by weight; 2-pyrrolidone, 5.0 parts by weight; and pure water, 53.4 parts by weight.

The content of each ingredient in terms of the percentage weight in the ink obtained were: titanium dioxide particles, 10.0%; oligomer, 3.0%; monomer, 10.0%; photoinitiator, 2.0%; ethyleneglycol, 5.0%; 2-pyrrolidone, 5.0%.

(No. 4-8)

Water-base ink was produced using the same method as in the first embodiment and using colorant B (pigment including carbon black). The amount of each ingredient added were: dispersion liquid of colorant B, 33.3 parts by weight; oligomer emulsion, 18.4 parts by weight; monomer, 7.0 parts by weight; photoinitiator, 1.0 parts by weight; ethyleneglycol, 5.0 parts by weight; 2-pyrrolidone, 5.0 parts by weight; and pure water, 30.3 parts by weight.

The content of each ingredient in terms of the percentage weight in the ink obtained were: carbon black particles, 10.0%; oligomer, 7.0%; monomer, 7.0%; photoinitiator, 1.0%; ethyleneglycol, 5.0%; and 2-pyrrolidone, 5.0%.

(No. 4-9)

Water-base ink was produced using the same method as in the first embodiment and using colorant C (pigment including titanium dioxide). The amount of each ingredient added were: dispersion liquid of colorant C, 1.7 parts by weight; oligomer emulsion, 18.4 parts by weight; monomer, 7.0 parts by weight; photoinitiator, 1.0 parts by weight; ethyleneglycol, 5.0 parts by weight; 2-pyrrolidone, 5.0 parts by weight; and pure water, 58.6 parts by weight.

The content of each ingredient in terms of the percentage weight in the ink obtained were: titanium dioxide particles, 1.0%; oligomer, 7.0%; monomer, 7.0%; photoinitiator, 1.0%; ethyleneglycol, 5.0%; 2-pyrrolidone, 5.0%.

(No. 4-10)

Water-base ink was produced using the same method as in the first embodiment and using colorant B (pigment including carbon black). The amount of each ingredient added were: dispersion liquid of colorant B, 3.3 parts by weight; oligomer emulsion, 18.4 parts by weight; monomer, 7.0 parts by weight; photoinitiator, 1.0 parts by weight; ethyleneglycol, 5.0 parts by weight; 2-pyrrolidone, 5.0 parts by weight; and pure water, 61.2 parts by weight.

The content of each ingredient in terms of the percentage weight in the ink obtained were: carbon black particles, 1.0%; oligomer, 7.0%; monomer, 7.0%; photoinitiator, 1.0%; ethyleneglycol, 5.0%; and 2-pyrrolidone, 5.0%.

(No. 4-11)

Water-base ink was produced using the same method as in the first embodiment and using colorant C (pigment including titanium dioxide). The amount of each ingredient added were: dispersion liquid of colorant C, 41.7 parts by weight; oligomer emulsion, 18.4 parts by weight; monomer, 7.0 parts by weight; photoinitiator, 1.0 parts by weight; ethyleneglycol, 5.0 parts by weight; 2-pyrrolidone, 5.0 parts by weight; and pure water, 21.9 parts by weight.

The content of each ingredient in terms of the percentage weight in the ink obtained were: titanium dioxide particles, 25.0%; oligomer, 7.0%; monomer, 7.0%; photoinitiator, 1.0%; ethyleneglycol, 5.0%; and 2-pyrrolidone, 5.0%.

(No. 4-12)

Water-base ink was produced using the same method as in the first embodiment and using colorant C (pigment including titanium dioxide). The amount of each ingredient added were: dispersion liquid of colorant C, 16.7 parts by weight; oligomer emulsion, 18.4 parts by weight; monomer, 7.0 parts by weight; photoinitiator, 1.0 parts by weight; ethyleneglycol, 5.0 parts by weight; 2-pyrrolidone, 5.0 parts by weight; and pure water, 52.9 parts by weight.

The content of each ingredient in terms of the percentage weight in the ink obtained were: titanium dioxide particles, 10.0%; oligomer, 7.0%; monomer, 7.0%; photoinitiator, 1.0%; ethyleneglycol, 5.0%; and 2-pyrrolidone, 5.0%.

(No. 4-13)

Water-base ink was produced using the same method as in the first embodiment and using colorant C (pigment including titanium dioxide). The amounts of each ingredient added were: dispersion liquid of colorant C, 16.7 parts by weight; oligomer emulsion, 2.6 parts by weight; monomer, 1.0 parts by weight; photoinitiator, 1.0 parts by weight; ethyleneglycol, 5.0 parts by weight; 2-pyrrolidone, 5.0 parts by weight; and pure water, 62.7 parts by weight.

The content of each ingredient in terms of the percentage weight in the ink obtained were: titanium dioxide particles, 10.0%; oligomer, 1.0%; monomer, 7.0%; photoinitiator, 1.0%; ethyleneglycol, 5.0%; and 2-pyrrolidone, 5.0%.

(No. 4-14)

Water-base ink was produced using the same method as in the first embodiment and using colorant C (pigment including titanium dioxide). The amount of each ingredient added were: dispersion liquid of colorant C, 16.7 parts by weight; oligomer emulsion, 18.4 parts by weight; monomer, 7.0 parts by weight; photoinitiator, 0.1 parts by weight; ethyleneglycol, 5.0 parts by weight; 2-pyrrolidone, 5.0 parts by weight; and pure water, 47.8 parts by weight.

The content of each ingredient in terms of the percentage weight in the ink obtained were: titanium dioxide particles, 10.0%; oligomer, 7.0%; monomer, 7.0%; photoinitiator, 0.1%; ethyleneglycol, 5.0%; and 2-pyrrolidone, 5.0%.

(No. 4-15)

Water-base ink was produced using the same method as in the first embodiment and using colorant C (pigment including titanium dioxide). The amount of each ingredient added were: dispersion liquid of colorant C, 5.0 parts by weight; oligomer emulsion, 18.4 parts by weight; monomer, 7.0 parts by weight; photoinitiator, 1.0 parts by weight; ethyleneglycol, 5.0 parts by weight; 2-pyrrolidone, 5.0 parts by weight; and pure water, 58.6 parts by weight.

The content of each ingredient in terms of the percentage weight in the ink obtained were: titanium dioxide particles, 3.0%; oligomer, 7.0%; monomer, 7.0%; photoinitiator, 1.0%; ethyleneglycol, 5.0%; and 2-pyrrolidone, 5.0%.

(No. 4-16)

Water-base ink was produced using the same method as in the first embodiment and using colorant C (pigment including titanium dioxide). The amount of each ingredient added were: dispersion liquid of colorant C, 16.7 parts by weight; oligomer emulsion, 39.5 parts by weight; monomer, 7.0 parts by weight; photoinitiator, 1.0 parts by weight; ethyleneglycol, 5.0 parts by weight; 2-pyrrolidone, 5.0 parts by weight; and pure water, 25.8 parts by weight.

The content of each ingredient in terms of the percentage weight in the ink obtained were: titanium dioxide particles, 10.0%; oligomer, 15.0%; monomer, 7.0%; photoinitiator, 1.0%; ethyleneglycol, 5.0%; anf 2-pyrrolidone, 5.0%.
(No. 4-17)

The water-base ink was produced using the same method as in the first embodiment and using colorant C (pigment including titanium dioxide). The amount of each ingredient added were: dispersion liquid of colorant C, 16.7 parts by weight; oligomer emulsion, 18.4 parts by weight; monomer, 15.0 parts by weight; photoinitiator, 1.0 parts by weight; ethyleneglycol, 5.0 parts by weight; 2-pyrrolidone, 5.0 parts by weight; and pure water, 38.9 parts by weight.

The content of each ingredient in terms of the percentage weight in the ink obtained were: titanium dioxide particles, 10.0%; oligomer, 7.0%; monomer, 15.0%; photoinitiator, 1.0%; ethyleneglycol, 5.0%; and 2-pyrrolidone, 5.0%.

In this manner, photo polymerizing water-base ink containing titanium dioxide or carbon black, photo polymerization resin with monomer residing in the particles of oligomer in an emulsion state, ethyleneglycol, 2-pyrrolidone and photoinitiator. In each ink of No.4-1~4-17, content rate in terms of the percentage weight of 2-pyrrolidone and ethyleneglycol are constant at 5% each, but content rates of other ingredients are different.

Next, the performance of each ink was evaluated. First, in order to check the dispersion stability of each ink, each ink was left alone at room temperature for one week. Then the dispersion condition of the ink was examined. As a result, "O" was recorded for ink without any deposits and "X" was recorded for ink which had some deposits or had layer separation.

Moreover, in order to check the ejection properties of each ink, each ink was filled in the head of the ink jet printer "MJ510C", which was also used in the first embodiment, and was examined to see whether or not ink was ejected from the head nozzle. If ejection occurred "O" was recorded, and "X" was recorded if ejection did not occur.

Furthermore, each ink was tested for cleaning recovery and pencil hardness, similar to the first embodiment. The printing condition was set to be the same as in the first embodiment tests.

Moreover, in order to check the print concentration of each ink, a printing test was conducted for the same printed substrate with the same printing conditions as the printing test in the first embodiment, and confirmation of the printed characters with the naked eye was examined. If confirmation was possible, "O" was recorded but "X" was recorded otherwise.

Result of performance evaluation vs. the composition of each ink is summarized in Table 4.

The following conclusions are obtained from Table 4 concerning the content rate in terms of the percentage weight of each ingredient which constitutes the water-base ink. If the content rate in terms of the percentage weight of the colorant is higher than 3.0%, the print on the printed substrate is confirmed by the naked eye and if the rate in terms of the percentage weight is more than 25%, ejection of ink stops.

If the content rate in terms of the percentage weight of oligomer is 1.0%, dispersion stability of the ink and ejection from the ink jet nozzle is poor, and the ink film cannot be sufficiently hardened even with ultra-violet irradiation. If the rate is 15.0% in weight, ejection of ink from the ink jet nozzle stops.

If the content rate of monomer by weight is 1.0%, hardness of the ink film is not sufficient and if it is 15.0%, dispersion stability is poor with some deposits occurring, and ejection of ink from ink jet nozzle stops.

If the content rate in terms of the percentage weight of photoinitiator is 0.1%, the hardness of the ink film is not sufficient. Here, there is no change in effect of photoinitiator if the content rate of the photoinitiator exceeds 2.0%.

From the above discussions, the water-base ink containing titanium dioxide or carbon black with ratio in terms of the percentage weight of between 3% to 20%, photo polymerization resin in which monomers reside in oligomer particles in emulsion state with each content ratio in terms of the percentage weight of between 3% and 10% for oligomer (urethane type oligomer) and monomer (pentaerythritol polyacrylate), ethyleneglycol with the rate of 5%, 2-pyrrolidone with ratio of 5%, and photoinitiator with a rate between 0.3% and 2.0% is found to have superior properties in all aspects including dispersion stability of ink, ejection property from the ink jet nozzle, continuous ink jet printability, ink film hardness, and print characteristics on a printed substrate.

Fifth Embodiment

Inks No. 5-1~5-10 having a different ink ingredient mixture ratio were produced using the same material and the same method as the first embodiment.

In this embodiment, one of 2-pyrrolidone, N-acryloyl morpholine, or N-vinyl-2-pyrrolidone, or both of 2-pyrrolidone and N-acryloyl morpholine were added as a polar solvent with the content rate in terms of the percentage weight as described in Table 5.

As colorant, the colorant A (titanium dioxide) used in the first embodiment was added in such a manner that the content rate in terms of the percentage weight in the ink becomes 15.4%. Oligomer is added in such a manner that the content rate in terms of the percentage weight of the oligomer becomes 7.0%. Content rate in weight of monomer, photoinitiator and ethyleneglycol were 7.0%, 1.0% and 5.0% respectively.

Next, the performance of each ink was evaluated. First, each ink was left alone for 10 days in an open atmosphere at 50° C. to examine dispersion stability of each ink. As a result, "O" was recorded if no change was found in the ink dispersion condition, while "X" was recorded if deposits occurred. Moreover, for each ink, a cleaning recoverability test was conducted in a manner similar to the first embodiment with the same printing condition as the first embodiment.

The composition and performance evaluation of each ink is summarized in Table 5.

From Table 5, it is clear that addition of both 2-pyrrolidone and N-acryloyl morpholine with total content ratio in terms of the percentage weight of 10% as in No. 5-2~5-4 result in higher cleaning recovery than addition of either 2-pyrrolidone or N-acryloyl morpholine alone with content rate in terms of the percentage weight of 10% as in No. 5-1, 5-5, and 5-6 as polar solvent to be used, especially in the ink of the present invention. Of these, No. 5-3 in which 2-pyrrolidone and N-acryloyl morpholine are added in equal amount and exhibited particularly higher cleaning recovery, making it the best ink jet ink.

Moreover, No. 5-7 contains 2-pyrrolidone and N-acryloyl morpholine in a 1:1 ratio, with a combined content rate in the ink of 4.0% in terms of the percentage weight, and is found to have better cleaning recovery than No. 5-1, 5-5, and 5-6, which contain only one of 2-pyrrolidone, N-acryloyl morpholine or N-vinyl 2-pyrrolidone with content rate of 10.0% in terms of the percentage weight.

Furthermore, it is clear that addition of only one of 2-pyrrolidone, N-acryloyl morpholine or N-vinyl 2-pyrrolidone with content rate of 10.0% in terms of the percentage weight as in No. 5-8~5-10 results in poor dispersion stability and cleaning recovery. Therefore, the ink with the composition of this embodiment is found to be unusable as ink jet ink.

FIELD OF APPLICATION

From the explanations above, it is clear that the photopolymerization ink of the present invention has superior characteristics (dispersion stability, printing stability, cleaning recovery and others) as ink jet printing ink while maintaining ink film hardness and chemical proof properties.

In particular, the ink containing 2-pyrrolidone and N-acryloyl morpholine in a combined ratio of 10% or less in terms of the percentage weight results in superior characteristics (dispersion stability, cleaning recovery and others) as ink jet printing ink.

Moreover, ink with a polar solvent having reaction radicals that react with photo polymerization resin produces, when used in ink jet printing, an ink with extremely high printing stability and extremely high ink film hardness with light irradiation.

Furthermore, the ink jet printing method of the present invention enables printing onto a printed substrate. Traditionally, screen printing was used for printing onto a printed substrate, but the methods of the present invention enable ink jet printing for printing onto a printed substrate which significantly reduces the amount of ink used in printing on a printed substrate.

TABLE 1

| No. | Polar solvent in ink composition (wt %) 2-pyrrolidone | Pigment | Cleaning recovery | Printing stability | Pencil hardness | Chemical proof |
|---|---|---|---|---|---|---|
| 1-1 | 2.0 | $TiO_2$ 15.4 | 8/10 | 3/5 | 3H | A |
| 1-2 | 5.0 | $TiO_2$ 15.4 | 8/10 | 3/5 | 3H | A |
| 1-3 | 8.0 | $TiO_2$ 15.4 | 7/10 | 3/5 | 3H | A |
| 1-4 | 5.0 | C.B. 9.9 | 9/10 | 4/5 | 4H | A |
| 1-5 | 0.0 | $TiO_2$ 15.4 | 2/10 | 0/5 | 3H | A |

*Common composition: Oligomer 7.6 wt %, Monomer 8.0 wt %, Initiator 1.5 wt %, Ethyleneglycol 5 wt %, remainder is water

TABLE 2

| No. | Polar solvent in ink composition (wt %) N-vinyl 2-pyrrolidone | Pigment | Cleaning recovery | Printing stability | Pencil hardness | Chemical proof |
|---|---|---|---|---|---|---|
| 2-1 | 2.0 | $TiO_2$ 15.4 | 8/10 | 4/5 | 3H | A |
| 2-2 | 5.0 | $TiO_2$ 15.4 | 7/10 | 3/5 | 3H | A |
| 2-3 | 8.0 | $TiO_2$ 15.4 | 7/10 | 3/5 | 3H | A |
| 2-4 | 5.0 | C.B. 9.9 | 9/10 | 4/5 | 4H | A |
| 2-5 | 0.0 | $TiO_2$ 15.4 | 2/10 | 0/5 | 3H | A |

*Common composition: Oligomer 7.6 wt %, Monomer 8.0 wt %, Initiator 1.5 wt %, Ethyleneglycol 5 wt %, remainder is water

TABLE 3

| No. | Polar solvent ink composition (wt %) N-acryloyl morpholine | Pigment | Cleaning recovery | Dot removal | Exhaust distortion | Pencil hardness | Chemical proof |
|---|---|---|---|---|---|---|---|
| 3-1 | 2.0 | $TiO_2$ 15.4 | 8/10 | 3/64 | 7/64 | 4H | A |
| 3-2 | 5.0 | $TiO_2$ 15.4 | 10/10 | 1/64 | 5/64 | 5H | A |
| 3-3 | 8.0 | $TiO_2$ 15.4 | 10/10 | 2/64 | 10/64 | 5H | A |
| 3-4 | 5.0 | C.B. 9.9 | 10/10 | 0/64 | 6/64 | 5H | A |
| 3-5 | 0.0 | $TiO_2$ 15.4 | 2/10 | 10/64 | 35/64 | 3H | A |
| 3-6 | 5.0 (P) | $TiO_3$ 15.4 | 8/10 | 5/64 | 15/64 | 3H | A |

*Common composition: Oligomer 7.6 wt %, Monomer 8.0 wt %, Initiator 1.5 wt %, Ethyleneglycol 5 wt %, remainder is water

TABLE 4

| No. | Polar solvent in ink composition (wt %) Pigment | Oligomer | Monomer | Initiator | Dispersion stability | Exhaustion | Cleaning recovery | Printing density | Pencil Hardness |
|---|---|---|---|---|---|---|---|---|---|
| 4-1 | 5.0 ($TiO_2$) | 7.0 | 7.0 | 1.0 | ○ | ○ | 10/10 | ○ | 5H |
| 4-2 | 10.0 ($TiO_2$) | 7.0 | 7.0 | 1.0 | ○ | ○ | 8/10 | ○ | 5H |
| 4-3 | 15.0 ($TiO_2$) | 7.0 | 7.0 | 1.0 | ○ | ○ | 8/10 | ○ | 4H |
| 4-4 | 20.0 ($TiO_2$) | 7.0 | 7.0 | 1.0 | ○ | ○ | 7/10 | ○ | 3H |
| 4-5 | 10.0 ($TiO_2$) | 7.0 | 7.0 | 0.3 | ○ | ○ | 9/10 | ○ | 3H |
| 4-6 | 10.0 ($TiO_2$) | 10.0 | 3.0 | 2.0 | ○ | ○ | 8/10 | ○ | 4H |

TABLE 4-continued

| | Polar solvent in ink composition (wt %) | | | | Performance evaluation | | | | |
|---|---|---|---|---|---|---|---|---|---|
| No. | Pigment | Oligomer | Monomer | Initiator | Dispersion stability | Exhaustion | Cleaning recovery | Printing density | Pencil Hardness |
| 4-7 | 10.0 (TiO$_2$) | 3.0 | 10.0 | 2.0 | ○ | ○ | 6/10 | ○ | 3H |
| 4-8 | 10.0 (C.B.) | 7.0 | 7.0 | 1.0 | ○ | ○ | 9/10 | ○ | 5H |
| 4-9 | 1.0 (TiO$_2$) | 7.0 | 7.0 | 1.0 | ○ | ○ | 9/10 | X | 4H |
| 4-10 | 1.0 (C.B.) | 7.0 | 7.0 | 1.0 | ○ | ○ | 10/10 | X | 5H |
| 4-11 | 25.0 (TiO$_2$) | 7.0 | 7.0 | 1.0 | X | X | — | — | — |
| 4-12 | 10.0 (TiO$_2$) | 7.0 | 1.0 | 1.0 | ○ | ○ | 9/10 | ○ | H |
| 4-13 | 10.0 (TiO$_2$) | 1.0 | 7.0 | 1.0 | X | X | — | — | — |
| 4-14 | 10.0 (TiO$_2$) | 10.0 | 7.0 | 0.1 | ○ | ○ | 9/10 | ○ | 2B |
| 4-15 | 3.0 (TiO$_2$) | 7.0 | 1.0 | 1.0 | ○ | ○ | 8/10 | ○ | 2H |
| 4-16 | 10.0 (TiO$_2$) | 15.0 | 7.0 | 1.0 | X | X | — | — | — |
| 4-17 | 10.0 (TiO$_2$) | 7.0 | 15.0 | 1.0 | X | X | — | — | — |

*Common composition: Ethyleneglycol 5 wt %, 2-pyrrolidone 5 wt %, remainder is water

TABLE 5

| | Polar solvent in ink deposition (wt %) | | | Performance evaluation | |
|---|---|---|---|---|---|
| No. | 2-pyrrolidone | N-acryloyl morpholine | N-vinyl-pyrrolidone | Dispersion stability | Cleaning recovery |
| 5-1 | 0 | 10.0 | 0 | O | 7/10 |
| 5-2 | 2.0 | 8.0 | 0 | O | 8/10 |
| 5-3 | 5.0 | 5.0 | 0 | O | 9/10 |
| 5-4 | 8.0 | 2.0 | 0 | O | 8/10 |
| 5-5 | 10.0 | 0 | 0 | O | 7/10 |
| 5-6 | 0 | 0 | 10.0 | O | 7/10 |
| 5-7 | 2.0 | 2.0 | 0 | O | 8/10 |
| 5-8 | 0 | 12.0 | 0 | x | 0/10 |
| 5-9 | 12.0 | 0 | 0 | x | 0/10 |
| 5-10 | 0 | 0 | 12.0 | x | 0/10 |

*Common composition: TiO$_2$ 15.4 wt %, Oligomer 7.0 wt %, Monomer 7.0 wt %, Initiator 1.0 wt %, Ethyleneglycol 5 wt %, remainder is water

What is claimed is:

1. A photo polymerizing water-base ink, comprising:
a colorant;
a photo polymerization resin, the photo polymerization resin including oligomer particles and monomer in an emulsion state;
a photoinitiator;
a water-base solvent; and
a polar solvent comprising 2-pyrrolidone and N-acryloyl morpholine in a weight ratio of between 0.1% to 10%, wherein the weight ratio is based on a 100% total weight of the water-base ink.

2. The water-base ink of claim 1, further including a penetrant including an organic solvent having a high boiling point other than said polar solvent.

3. The water-base ink of claim 1, the oligomer weighing in a range of 3% to 10% in terms of percentage weight, and the monomer including dipentaerythritol polyacrylate in a range of 3% to 10% in terms of percentage weight, and further including:
2-pyrrolidone and N-acryloyl morpholine in a combined range 0.1% to 10% in terms of percentage weight, and
photoinitiator in a range of 0.3% to 2.0% in terms of percentage weight, ethylene glycol in a range of 2% to 20% in terms of percentage weight, and pigment including titanium dioxide particles, as colorant, in a range of 3% to 20% in terms of the percentage weight, wherein the percentage weights are based on a 100% total weight of the water-base ink.

4. A photo polymerizing water-base ink, comprising:
a colorant;
a photo polymerization resin, the photo polymerization resin including oligomer particles and monomers in an emulsion state;
a photoinitiator;
a water-base solvent; and
a polar solvent comprising 2-pyrrolidone and N-acryloyl morpholine, wherein the polar solvent has a reactive group reacting with the photo polymerization resin.

5. A method of manufacturing the photo polymerizing water-base ink of claim 1, comprising the steps of:
adding monomer to an emulsion;
agitating the monomer added to the emulsion;
dispersing oligomer in water to obtain oligomer particles, causing monomer and the oligomer particles to be in an emulsion state, the emulsion state defining the photo polymerization resin comprising the monomer and the oligomer in combination; and
subsequently adding the polar solvent comprising 2-pyrrolidone and N-acryloyl morpholine.

6. The ink production method of claim 5, the photoinitiator and monomer being added to and agitated in an emulsion.

7. An ink jet printing method, comprising:
applying the water-base ink of claim 1 on a printing surface in a predetermined pattern by ejecting the water-base ink with an ink jet apparatus; and
subsequently fixing the colorant on the printing surface by polymerizing the photopolymerization resin in the ink by irradiating light onto the printing surface.

8. The ink jet printing method of claim 7, wherein the ink contains a photoinitiator which is activated by ultra-violet ray irradiation and the irradiation is ultra-violet ray irradiation.

9. The ink jet printing method of claim 8, the ultra-violet ray irradiation being conducted with ultra-violet illumination of 100–10,000 mJ/cm$^2$.

10. A printed material printed by the ink jet printing method of claim 7.

11. A printed substrate production method, comprising:

printing on a printed substrate by the ink jet printing method of claim 7 wherein said water-base ink contains a pigment including titanium dioxide as a colorant.

12. A printed substrate printed by the ink jet printing method of claim 7 wherein said water-base ink contains a pigment including titanium dioxide as a colorant.

* * * * *